(12) United States Patent
Matsumoto et al.

(10) Patent No.: US 6,421,124 B1
(45) Date of Patent: Jul. 16, 2002

(54) POSITION DETECTING SYSTEM AND DEVICE MANUFACTURING METHOD USING THE SAME

(75) Inventors: Takahiro Matsumoto; Koichi Sentoku, both of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/203,584

(22) Filed: Dec. 2, 1998

(30) Foreign Application Priority Data

Dec. 3, 1997 (JP) .............................................. 9-348587
Nov. 25, 1998 (JP) ........................................... 10-350746

(51) Int. Cl.[7] .............................................. G01B 11/00
(52) U.S. Cl. ...................................................... 356/401
(58) Field of Search ......................................... 356/401

(56) References Cited

U.S. PATENT DOCUMENTS

| | | | |
|---|---|---|---|
| 4,037,969 A | 7/1977 | Feldman et al. | 356/172 |
| 4,311,389 A | 1/1982 | Fay et al. | 356/354 |
| 4,326,805 A | 4/1982 | Feldman et al. | 356/399 |
| 4,355,892 A | * 10/1982 | Mayer et al. | 356/401 |
| 4,856,905 A | 8/1989 | Nishi | 356/401 |
| 4,938,598 A | 7/1990 | Akiyama et al. | 356/375 |
| 5,114,236 A | * 5/1992 | Matsugu et al. | 356/401 |
| 5,196,711 A | 3/1993 | Matsugu et al. | 250/548 |
| 5,200,800 A | 4/1993 | Suda et al. | 356/401 |
| 5,285,259 A | 2/1994 | Saitoh | 356/401 |
| 5,313,272 A | 5/1994 | Nose et al. | 356/375 |
| 5,333,050 A | 7/1994 | Nose et al. | 356/356 |
| 5,369,486 A | 11/1994 | Matsumoto et al. | 356/349 |
| 5,377,009 A | 12/1994 | Kitaoka et al. | 356/401 |
| 5,396,335 A | 3/1995 | Hasegawa et al. | 356/401 |
| 5,432,603 A | 7/1995 | Sentoku et al. | 356/349 |
| 5,455,679 A | 10/1995 | Houryu et al. | 356/401 |
| 5,465,148 A | 11/1995 | Matsumoto et al. | 356/349 |
| 5,481,363 A | 1/1996 | Matsugu et al. | 356/401 |
| 5,550,635 A | 8/1996 | Saitoh et al. | 356/401 |
| 5,585,923 A | 12/1996 | Nose et al. | 356/363 |
| 5,610,718 A | 3/1997 | Sentoku et al. | 356/363 |
| 5,625,453 A | 4/1997 | Matsumoto et al. | 356/351 |
| 5,682,239 A | 10/1997 | Matsumoto et al. | 356/349 |
| 5,717,492 A | 2/1998 | Sentoku et al. | 356/401 |

FOREIGN PATENT DOCUMENTS

JP            56-157033            12/1981

* cited by examiner

*Primary Examiner*—Richard A. Rosenberger
(74) *Attorney, Agent, or Firm*—Fitzpatrick, Cella, Harper & Scinto

(57) ABSTRACT

A position detecting system for producing relative positional information related to first and second objects, is wherein the system includes a light projecting device for projecting light toward the first and second objects disposed opposed to each other and having physical optic elements, the light projecting device being capable of projecting lights of different wavelengths, a light detecting device for detecting light emitted from the light projecting device and being influenced by both of the physical optic elements of the first and second objects, wherein relative positional information related to the first and second objects is produced on the basis of the detection by the light detecting device, and a spacing setting device for changing the spacing between the first and second objects in accordance with a wavelength of light to be projected by the light projecting device.

20 Claims, 11 Drawing Sheets

POSITION DETECTING SYSTEM AND DEVICE MANUFACTURING METHOD USING THE SAME

FIELD OF THE INVENTION AND RELATED ART

This invention relates to a position detecting method and a system therefor, and to a device manufacturing method using the same. More specifically, the present invention is suitable for use in a proximity type exposure apparatus or a stepper type or scan type exposure apparatus, for example, for the manufacture of devices such as semiconductor devices (e.g., IC or LSI), image pickup devices (e.g., CCD), display devices (e.g., liquid crystal panel), or magnetic heads, for example, wherein, when a fine electronic pattern formed on a first object such as a mask or a reticle (hereinafter "mask") is to be transferred by exposure to the surface of a second object such as a wafer, the spacing between the mask and the wafer is to be measured and is to be controlled to a predetermined value, for relative positioning (alignment) of them.

Conventionally, in exposure apparatus for semiconductor device manufacture, relative positioning of a mask and a wafer is an important factor for improvement of performance. Particularly, in recent exposure apparatuses, very high alignment precision of an order of a submicron or smaller is required because of further enlargement of integration of a semiconductor chip.

In many alignment systems, the spacing between a mask and a wafer is measured by using a surface interval measuring device and, after it is controlled into a predetermined spacing, the alignment operation for the mask and the wafer is performed on the basis of positional information which can be obtained through alignment patterns (alignment marks) provided on scribe lines on the mask and wafer surfaces.

As for an alignment method therefor, U.S. Pat. No. 4,037,969 or Japanese Laid-Open Patent Application, Laid-Open No. 157033/1981 shows the use of a zone plate as an alignment pattern, wherein light is projected to the zone plate and wherein the position of a light convergence point, on a predetermined plane, of the light from the zone plate is detected.

U.S. Pat. No. 4,311,389 shows an alignment pattern provided on a mask surface and having a diffraction optical function like a cylindrical lens, and a dot-like alignment pattern is provided on a wafer surface which functions so that the light quantity of diffraction light of a predetermined order becomes highest when the mask and the wafer are in alignment with each other. By detecting the light from the alignment marks of the mask and the wafer, a relative positional relation between the mask and the wafer is detected.

Among theses detecting methods, a method in which a straight diffraction grating or a zone plate is used as an alignment mark has an advantage that, because the detection is less affected by a fault within the mark, it assures relatively high precision alignment regardless of a semiconductor process.

FIG. 1A is a schematic view of a conventional position detecting system using a zone plate. In FIG. 1A, parallel light is emitted from a light source 72, and it passes through a half mirror 74. After this, the light is collected by a condenser lens 76 to a light convergence point 78. Then, the light is projected on a mask alignment pattern 168a, provided on a mask 168, and a wafer alignment mark 160a, provided on a wafer 160 which is placed on a support table 162.

Each of these alignment patterns 168a and 160a comprises a reflection type zone plate which functions to define a light convergence point upon a plane perpendicular to the optical axis, containing the convergence point 78. The amount of deviation of the light convergence point upon the plane is relayed by a condenser lens 76 and a lens 80 onto a detector 82, whereby it is detected. Then, on the basis of an output signal from the detector 82, a control circuit 84 actuates a driving circuit 164 so that the mask 168 and the wafer 160 are positioned relative to each other.

FIG. 1B is a schematic view for explaining the imaging relation of lights from the mask alignment pattern 168a and the wafer alignment pattern 160a, shown in FIG. 1A.

In FIG. 1B, a portion of light divergently emitted from the convergence point 78 is diffracted by the mask alignment pattern 168a, whereby a light convergence point 78a representing the mask position is formed in the neighborhood of the convergence point 78. Also, another portion of the light passes through the mask 168 as zero-th order transmissive light and, without changing its wavefront, it impinges on the alignment pattern 160a on the wafer 160. Here, the light is diffracted by the wafer alignment pattern 160a and, thereafter, it passes again through the mask 168 as zero-th order transmissive light. Then, it is collected in the neighborhood of the convergence point 78, and it defines a light convergence point 78b which represents the wafer position.

In FIG. 1B, when the light diffracted by the wafer 160 defines a light convergence point, the mask 168 functions as a mere transparent or translucent material. The position of the light convergence point 78b thus defined by the wafer alignment pattern 160a, bears a deviation $\Delta\sigma'$ along a plane perpendicular to the optical axis, containing the convergence point 78, the deviation corresponding to a deviation $\Delta\sigma$ of the wafer 160 with respect to the mask 168, in a direction (lateral direction) along the mask and wafer surfaces.

The deviation $\Delta\sigma'$ is then measured with reference to an absolute coordinate system defined on the sensor, whereby the deviation $\Delta\sigma$ is detected In the position detecting system shown in FIG. 1A, the intensity of diffraction light from the alignment pattern varies largely due to non-uniform film thickness of a mask membrane, to process dependency of the wafer, or to a difference in film thickness of a resist applied to the wafer surface. Depending on the wafer, therefor, a good signal-to-noise ratio (S/N ratio) for a satisfactory measurement signal light is not obtainable, and alignment signal stability is lowered. This obstructs high precision position detection. As an attempt to this problem, conventionally, light of a different wavelength is used to assure an increased S/N ratio.

However, in conventional examples wherein a zone plate is used as an alignment mark, due to chromatic aberration of the zone plate, diffraction light may not be imaged on a photodetector, causing defocus.

On that occasion, if the diffraction efficiency within the zone plate is not uniform, the detection precision is lowered extraordinarily. Further, if a zone plate corresponding to the different wavelength is provided on a mask, it causes enlargement of the area upon the mask to be occupied by the alignment mark. In a latest semiconductor manufacturing process wherein superposition of not less than 20 (twenty) layers is required, practically, it is difficult to place an alignment mark upon the mask surface.

SUMMARY OF THE INVENTION

It is an object of the present invention to provide a position detecting method and/or system by which relative positional deviation between first and second objects can be detected very precisely regardless of a change in state of the first and/or second object, such that high precision alignment is assured.

It is another object of the present invention to provide a device manufacturing method which is based on the position detecting method or system described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
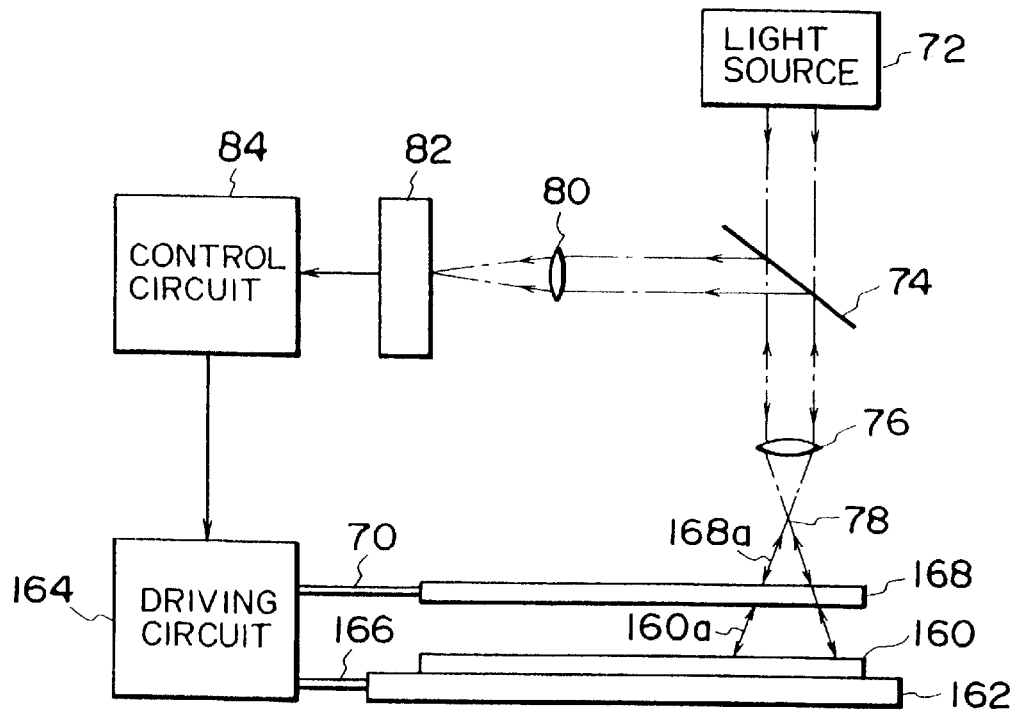
FIG. 1A is a schematic view of a main portion of a conventional position detecting system.
Figure 1B:
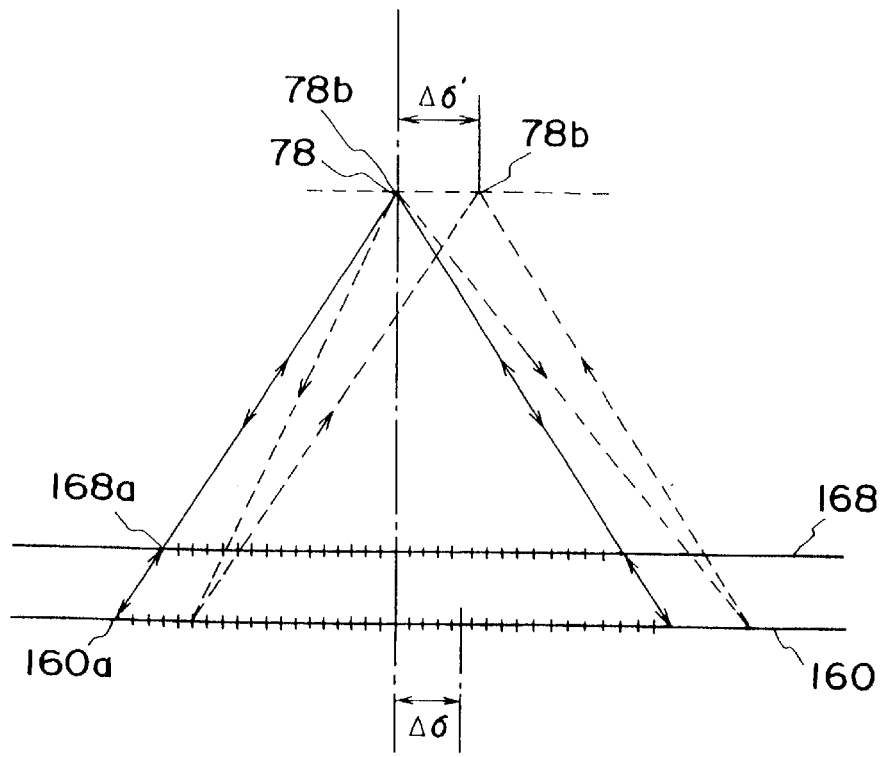
FIG. 1B is a schematic view for explaining position detection through a conventional position detecting system.
Figure 2A:
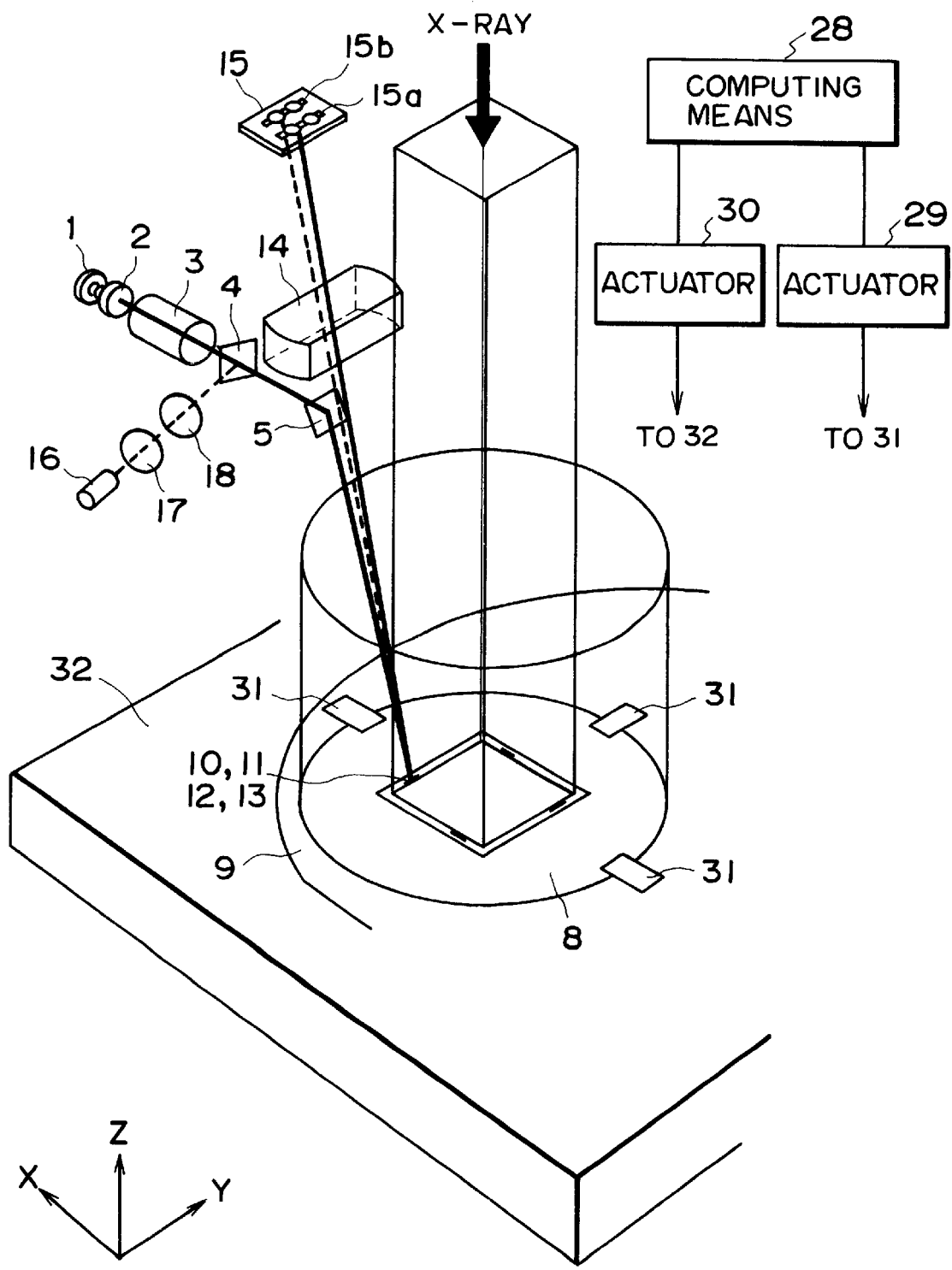
FIG. 2A is a schematic and perspective view of a main portion of a first embodiment of the present invention.
Figure 2B:
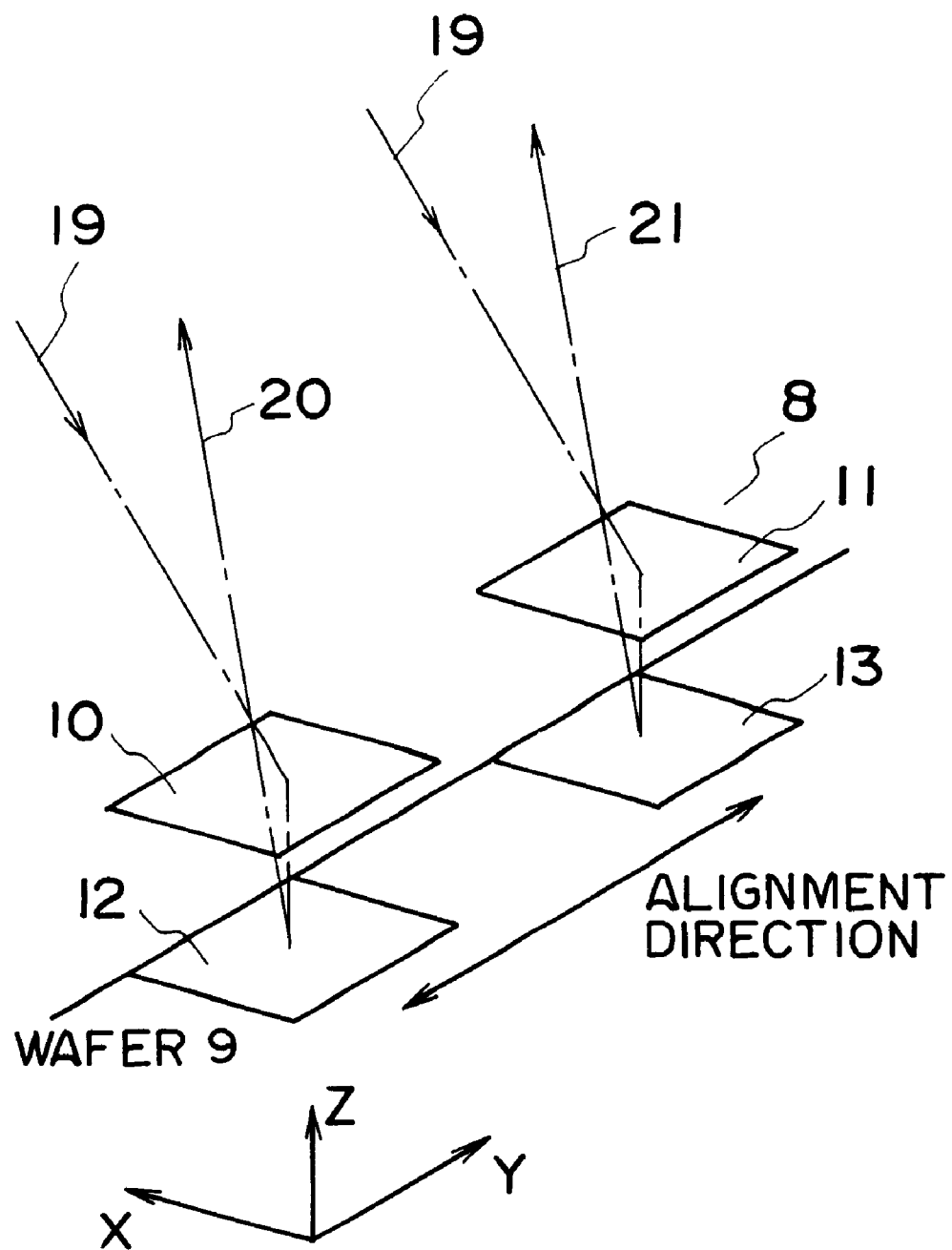
FIG. 2B is a schematic view for explaining alignment marks used in the first embodiment.

FIG. 2A is a schematic and perspective view of a main portion of a first embodiment of the present invention. FIG. 2B is an enlarged view of a portion of FIG. 2A. FIGS. 3–8 are views for explaining detection of relative position between first and second objects, in accordance with the first embodiment of the present invention.

In this embodiment, the invention is applied to an exposure apparatus of a proximity type, for the manufacture of devices such as semiconductor devices, for example. Denoted in the drawings at 8 is a mask (first object) having an electronic circuit pattern formed thereon. Denoted at 9 is a wafer (second object). Denoted at 10 and 11 are alignment marks (zone plates) provided on the mask 9 surface and comprising physical optic elements having a lens function and diffraction function. Denoted at 12 and 13 are alignment marks (zone plates) provided on the wafer 9 surface and comprising physical optic elements having a lens function and diffraction function.

In this embodiment, the physical optic elements 10–13 are used as alignment marks (AA marks) for detection with respect to the mask 8 and the wafer 9, in a direction along the surface thereof (i.e., lateral deviation detection). Thus, they serve as lateral deviation detecting alignment marks.

The physical optic elements 10–13 in this embodiment each comprises a grating lens or Fresnel zone plate having a one-dimensional or two-dimensional lens function, or a diffraction grating having no lens function, for example.

In this embodiment, light of a wavelength $\lambda_1$ from a light source 1 such as an LD, for example, is transformed by a collimator lens 2 into parallel light. The parallel light goes through a light projecting lens 3 and a half mirror 4, and it is deflected by a mirror 5. Then, the light passes through a filter 6, and it impinges on the physical optic elements 10 and 11 of the mask 8, which are placed within an exposure region 7. The light is influenced by an optical function of the physical optic elements 10 and 11, and it is then projected on the physical optic elements 12 and 13 of the wafer 9.

The diffraction light from the physical optic elements bears information that represents the amount of lateral deviation between the mask 8 and the wafer 9. After passing the filter 6, the light is imaged by a light receiving lens 14 upon a light receiving surface of a photodetector 15.

On the other hand, light of a wavelength $\lambda_2$ from a light source 16, being different from the wavelength $\lambda_1$, is transformed by a collimator lens 17 into parallel light. This parallel light goes through a light projecting lens 18 and the half mirror 4, and it is deflected by the mirror 5. After passing through the filter 6, it impinges on the physical optic elements 10 and 11 of the mask 8, within the exposure region 7. The light influenced by the optical function of the physical optic elements 10 and 11, is then projected on the physical optic elements 12 and 13 of the wafer 9.

Here, the elements denoted at 1–4 and 16–18 are components of light projecting means for selecting light of a predetermined wavelength, out of the lights of different wavelengths, and for irradiating the physical optic elements therewith.

Diffraction light from the physical optic elements bears information that represents the amount of lateral deviation between the mask 8 and the wafer 9, and after passing through the filter 6 it is imaged by the light receiving lens 14 upon the light receiving surface of the photodetector 15 which comprises two light receiving elements (line sensors) 15a and 15b. The light of wavelength $\lambda_1$ is detected by the line sensor 15a, while the light of wavelength $\lambda_1$ is detected by the line sensor 15b.

The photodetector 15 may comprise a two-dimensional area sensor, with a structure that its signal processing zone is made variable in accordance with the wavelength used.

FIG. 2B illustrates the relation between the disposition of the physical optic elements on the mask 8 and the wafer 9 of FIG. 2A and the light projected thereto. In FIG. 2B, light 19 from the light source 1 or the light source 16 is projected on the physical optic elements 10 and 11, whereby the light is diffracted. Then, diffraction lights 20 and 21 being diffracted by the physical optic elements 12 and 13 are directed to the photodetector 15.

Figure 3:
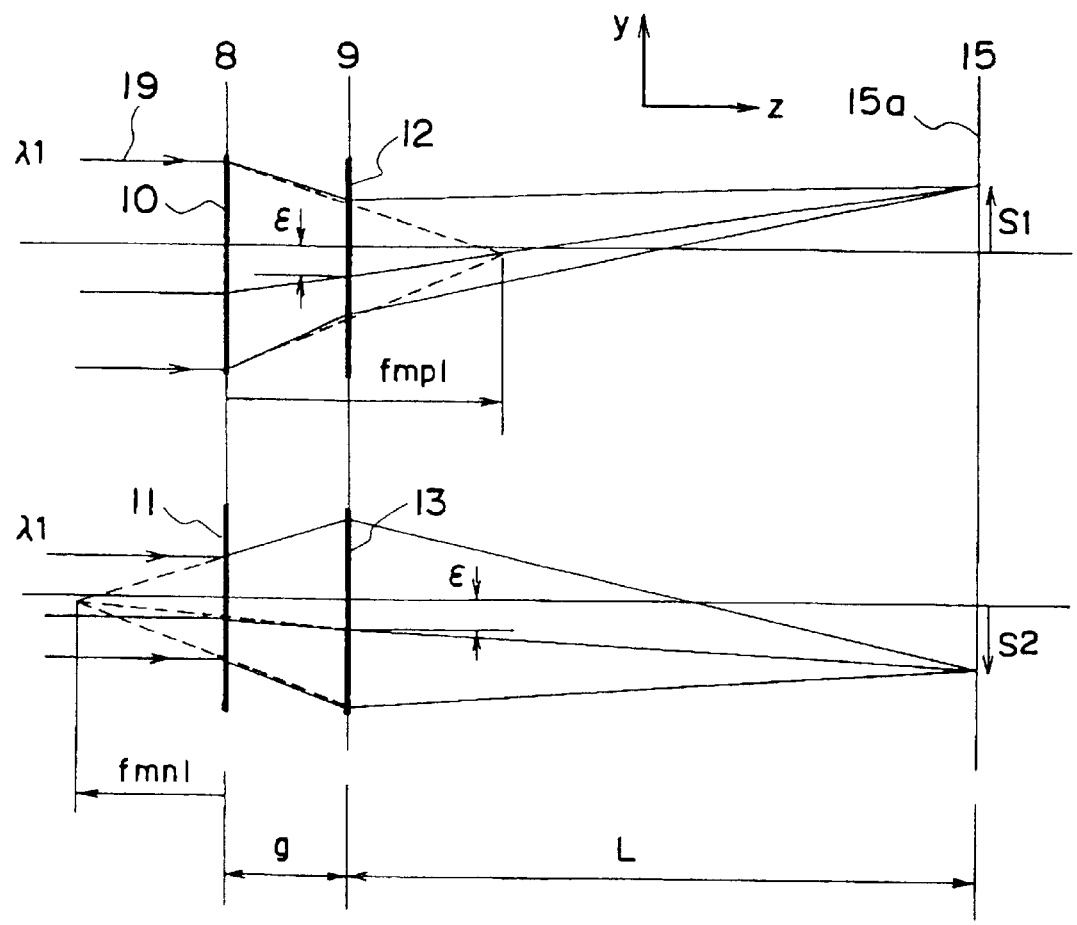
FIG. 3 is a schematic view for explaining detection of positional deviation, in accordance with the present invention.
Figure 4:
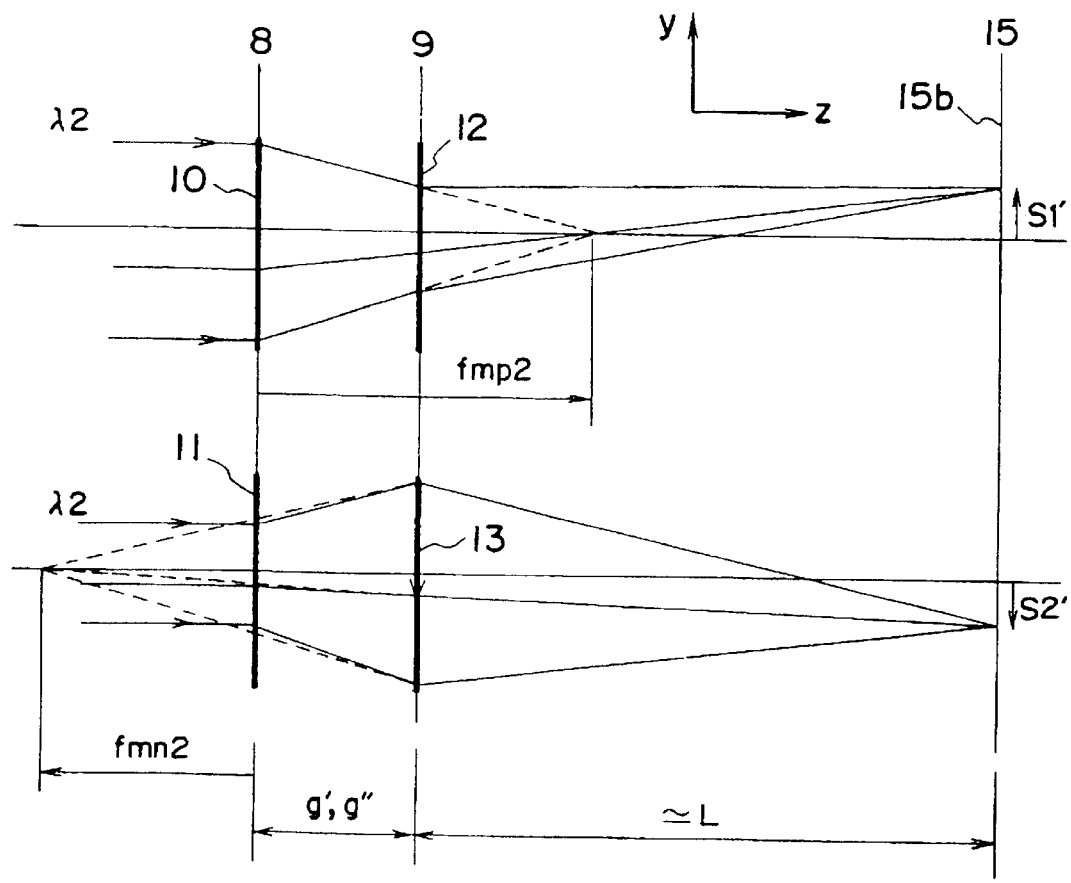
FIG. 4 is a schematic view for explaining detection of positional deviation, in accordance with the present invention.

FIGS. 3 and 4 are schematic views, respectively, for explaining the principle of a relative aligning method for the mask 8 and the wafer 9, based on the physical optic elements 10–13 shown in FIG. 2B. FIGS. 3 and 4 illustrate it in terms of a transmissive diffraction optical element which is equivalent to that of the first embodiment. In FIG. 3, on the mask 8 and the wafer 9, there are physical optic elements 10–13 each comprising a Fresnel zone plate having a lens function. Among them, physical optic elements 10 and 11 are placed on the mask 8, while physical optic elements 12 and 13 are placed on the wafer 9. The mask 8 and the wafer 9 are disposed with a spacing (gap) g.

The physical optic elements 10, 11, 12 and 13 have focal lengths $f_{mp1}$, $f_{mn1}$, $f_{wn1}$ and $f_{wp1}$, respectively, and light 19 (parallel light) of a wavelength $\lambda_1$ is projected to two physical optic elements 10 and 11 on the mask 8. The light influenced by the lens function of the physical optic elements 10 and 11, is convergently projected by the physical optic elements 12 and 13, placed at the opposed positions to the physical optic elements 10 and 11, respectively, onto the light receiving surface of the photodetector 15 which is at a distance L from the wafer 9.

Here, if the mask 8 and the wafer 9 mutually shift by $\epsilon$ in the Y direction, then two light spots collected on the light receiving surface of the photodetector 15 correspond to a change in optical disposition between the physical optic elements of the mask and the wafer. Thus, the position of a spot having been collected on the light receiving surface of the photodetector 15 displaces by the following amount:

$$S_1 = \{1 - [L/(f_{mp1} - g)]\} \times \epsilon \quad (1)$$

The position of convergence of the spot, having been collected on the photodetector 15, displaces by the following amount:

$$S_2 = \{1 - [L/(f_{mn1} - g)]\} \times \epsilon \quad (2)$$

Here, if $f_{mp1}$=230 microns, $f_{mn1}$=−230 microns, g=30 microns and L=20 mm, it follows that:

$$S_1 = -99 \cdot \epsilon$$

$$S_2 = 77.9 \cdot \epsilon$$

Thus, with respect to a relative positional deviation $\epsilon$ between the mask 8 and the wafer 9, upon the light receiving surface of the photodetector 15 there appears a change in spacing between the two spots as being magnified by 176.9 times.

In this embodiment, such a change in spot spacing is detected, by which the relative positional deviation $\epsilon$ between the mask 8 and the wafer 9 is detected with good precision.

For light convergence upon the photodetector 15, the focal lengths $f_{wn1}$ and $f_{wp1}$ of the wafer side zone plates 12 and 13 are determined in accordance with imaging formula, as follows:

$$1/L = 1/(f_{mp1} - g) + 1/f_{wn1} \quad (3)$$

$$1/L = 1/(f_{mn1} - g) + 1/f_{pn1} \quad (4)$$

In this embodiment, from equations (3) and (4), it follows that $f_{wn1}$=202 microns and $f_{wp1}$=256.7 microns. By using such an optical arrangement of the physical optic elements, light of a wavelength $\lambda_2$ is projected to the physical optic elements 10 and 11 of the mask 8, and, through the physical optic elements 12 and 13 of the wafer 9, it is collected upon the light receiving surface of the photodetector 15, such as shown in FIG. 4.

In a case wherein the focal length of a zone plate having been designed with respect to wavelength $\lambda_1$ is $f_1$, the focal length $f_2$ with respect to light of wavelength $\lambda_2$ can be approximated as $f_2 = f_1 \cdot (\lambda_1/\lambda_2)$. Thus, the focal lengths $f_{mp2}$ and $f_{mn2}$ of the mask side zone plates 10 and 11 with respect to the wavelength $\lambda_2$ can be expressed as follows:

$$f_{mp2} = f_{mp1} \cdot (\lambda_1/\lambda_2) \quad (5)$$

$$f_{mn2} = f_{mn1} \cdot (\lambda_1/\lambda_2) \quad (6)$$

Also, the focal lengths $f_{wn2}$ and $f_{wp2}$ of the wafer side zone plates 12 and 13 can be expressed as follows:

$$f_{wn2} = f_{wp1} \cdot (\lambda_1/\lambda_2) \quad (7)$$

$$f_{wp2} = f_{wn1} \cdot (\lambda_1/\lambda_2) \quad (8)$$

Here, the condition under which light is imaged on the photodetector 15 is such as follows:

$$1/L = 1/(f_{mp2} - g') + 1/f_{wn2} \quad (9)$$

$$1/L = 1/(f_{mn2} - g'') + 1/f_{pn2} \quad (10)$$

where g' is the gap (spacing) between the mask 8 and the wafer 9 with which the light (measuring beam 1) coming through the mask side zone plate 10 and the wafer side zone plate 12 is imaged upon the photodetector, and g" is the gap with which the light (measuring beam 2) coming through the zone plate 11 and the zone plate 13 is imaged upon the photodetector 15.

In equations (9) and (10), in the strict sense the distance L between the wafer 9 and the photodetector 15, if the wafer 9 is moved and the gap between the mask 8 and the wafer 9 is changed, changes with the change in gap between the mask 8 and the wafer 9. Thus, L=L'+g' and L=L'+g" (where L' is the distance between the mask 8 and the photodetector 15). However, in a case wherein the change in gap between the mask 8 and the wafer 9 is small as compared with the distance L' between the mask 8 and the photodetector 15, the above-described approximation will be sufficient.

From equation (9), it follows that:

$$g' = f_{mp2} - L \cdot f_{wn2}/(f_{wn2} - L) \quad (11)$$

from equation (10), it follows that:

$$g'' = f_{mn2} - L \cdot f_{wp2}/(f_{wp2} - L) \quad (12)$$

If $\lambda_1$=0.785 micron and $\lambda_2$=0.635 micron, from equations (11), (5) and (7), the gap with which the measuring beam 1 is imaged upon the photodetector 15 is g'=37.3 microns. From equations (12), (6) and (8), the gap with which the measuring beam 2 is imaged upon the photodetector 15 is g"=38.1 microns.

In this embodiment, an average of gaps g' and g" is taken. When the light of wavelength $\lambda_2$ is used, a gap setting means is used to set the gap to 37.9 microns and, in this state, the positional deviation between the mask 8 and the wafer 9 is detected. In this case, the magnification of spots $S_1$ and $S_2$ to the deviation between the mask 8 and the wafer 9 changes In equation (1), it the focal length $f_{mp1}$ is replaced by $f_{mp2}$ and calculation is made with g=38.1 microns, it follows that:

$$S_1' = -80.2 \cdot \epsilon$$

In equation (2), if the focal length $f_{mn1}$ is replaced by $f_{mn2}$ and calculation is made with g=38.1 microns, it follows that:

$$S_2' = 63.1 \cdot \epsilon$$

Thus, when alignment light of a wavelength $\lambda_2=0.635$ micron is used, for a positional deviation between the mask 8 and the wafer 9, the spacing between the spots shifts as being enlarged by 143.3 times.

This means that, when an alignment operation is to be made by use of different wavelengths, with respect to each wavelength, there is a necessity of preparing parameters (magnification and offset) for calculation of the positional deviation between the mask 8 and the wafer 9.

Further, even when another wavelength is to be used as alignment light, an appropriate gap may be calculated similarly by using equations (5)–(12). After setting the gap to that value by using a gap setting means, the positional deviation between the mask 8 and the wafer 9 may be detected. On that occasion, the positional deviation between the mask 8 and the wafer 9 can be detected at high precision on the basis of light imaged upon the photodetector 15, regardless of the alignment light wavelength.

Figure 6:
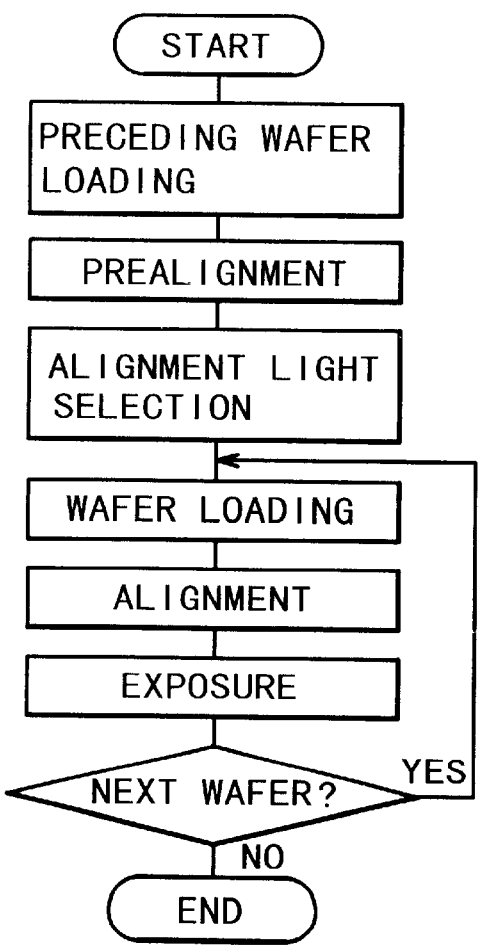
FIG. 6 is a flow chart for explaining a process for selecting a first optimum wavelength, in accordance with the present invention.

Next, the manner of selecting alignment light will be described with reference to sequences shown in FIGS. 6 and 7. In FIG. 6, after a preceding wafer is loaded, wafer prealignment is performed, and the wafer is moved to a position where a wafer alignment mark is disposed opposed to a mask alignment mark.

Then, the wafer is set into a gap corresponding to light of a wavelength $\lambda_1$ and light of a wavelength $\lambda_1$ is projected. Then, an alignment signal waveform is measured. Subsequently, the wafer is set into a gap corresponding to light of a wavelength $\lambda_2$, and light of a wavelength $\lambda_2$ is projected. An alignment signal waveform is then measured.

In this embodiment, as shown in FIG. 2A, the light of wavelength $\lambda_1$ and light of wavelength $\lambda_2$ are received by line sensors 15a and 15b of two lines, disposed in parallel along a direction perpendicular to the alignment direction.

Figure 5:
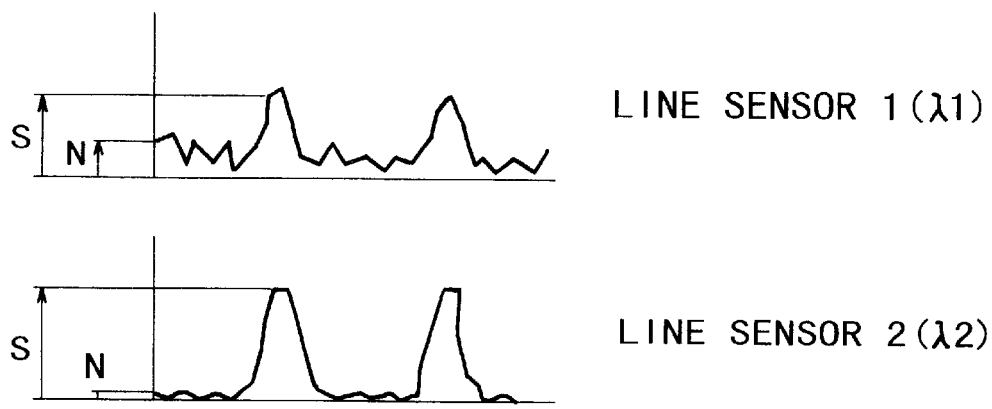
FIG. 5 is a schematic view for explaining a signal waveform upon a line sensor in the first embodiment.

FIG. 5 shows signal waveforms of lights as received by the line sensors 15a and 15b, respectively. As described, a preceding wafer is loaded and signal waveforms related to a few shots are accumulated into a signal storing means, and, while comparing S/N ratios of signal waveforms at the two wavelengths, a wavelength selecting means selects a relatively superior one (wavelength) as alignment light. After selection of the alignment light, the selected alignment light is used to perform the alignment operation, under a corresponding gap, and then an exposure sequence starts.

Figure 7:
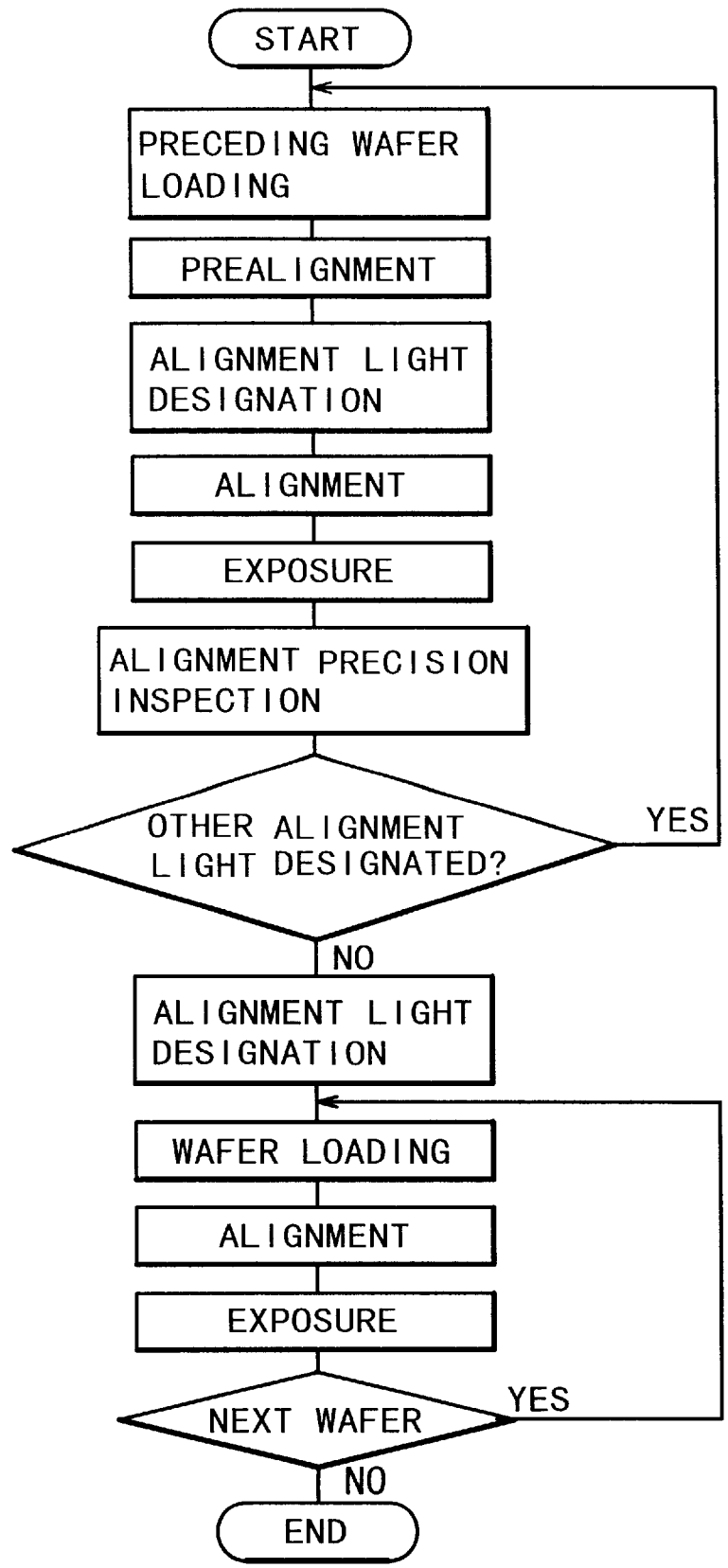
FIG. 7 is a flow chart for explaining a process for selecting a second optimum wavelength, in accordance with the present invention.
Figure 8:
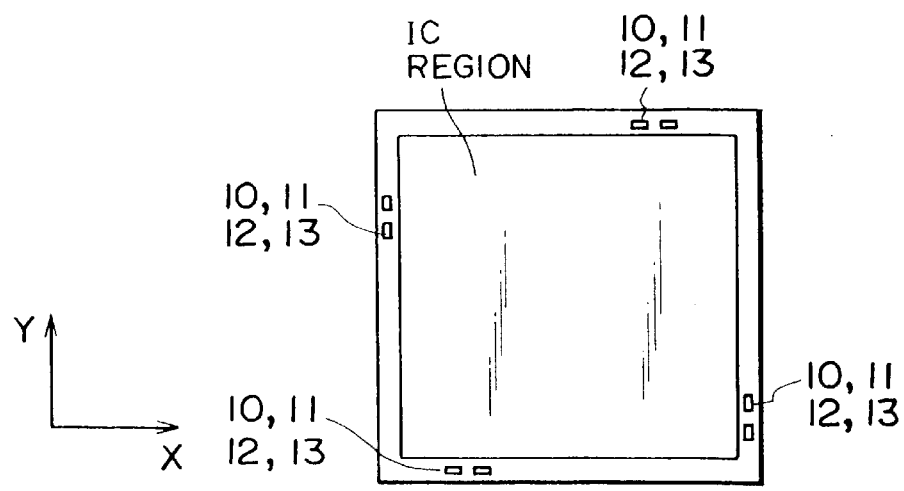
FIG. 8 is a schematic view of an alignment mark used in the first embodiment.

FIG. 7 illustrates another sequence for alignment light selection. As compared with the preceding example wherein a selection is made on the basis of evaluation of an alignment signal with respect to a wavelength level, in this example, with respect to each wavelength of alignment light one or more preceding wafers are used. With respect to each wavelength, an alignment operation is performed with an appropriate gap, and, after a gap for an exposure operation is set, the exposure process is performed. Exposure wafers are inspected by using a registration measuring device (superposition inspecting device), and alignment light of a wavelength that provides good reproducibility is designated. Then, an alignment operation is performed with a gap corresponding to the alignment light of that wavelength. After the exposure gap is set, the exposure operation is performed. As regards the alignment method, any of a die-by-die alignment method and a global alignment method may be used.

Although FIG. 2A illustrates alignment marks for detecting a positional deviation in one axial direction as well as an optical pickup for detection of these marks, practically, the structure according to this embodiment includes alignment marks and optical pickups therefor which are disposed with a 90 deg. angular relation such as shown in FIG. 4, so that the marks and pickups are juxtaposed with four sides of an exposure view field. Thus, on the basis of four positional deviation detection signals, a calculating means 28 calculates shift components in X and Y directions as well as chip rotation. In accordance with the calculated relative positional deviation, movement amounts of a mask holding device 31 and a wafer stage 32 are determined. Corresponding drive signals are then applied to actuators 29 and 30. On the basis of these signals, the mask holding device 31 and the wafer stage 32 move the mask 8 and the wafer 9.

While this embodiment has been described with reference to use of two wavelengths $\lambda_1$ and $\lambda_2$, three or more wavelengths may be used and one of them may be selected.

Figure 9:
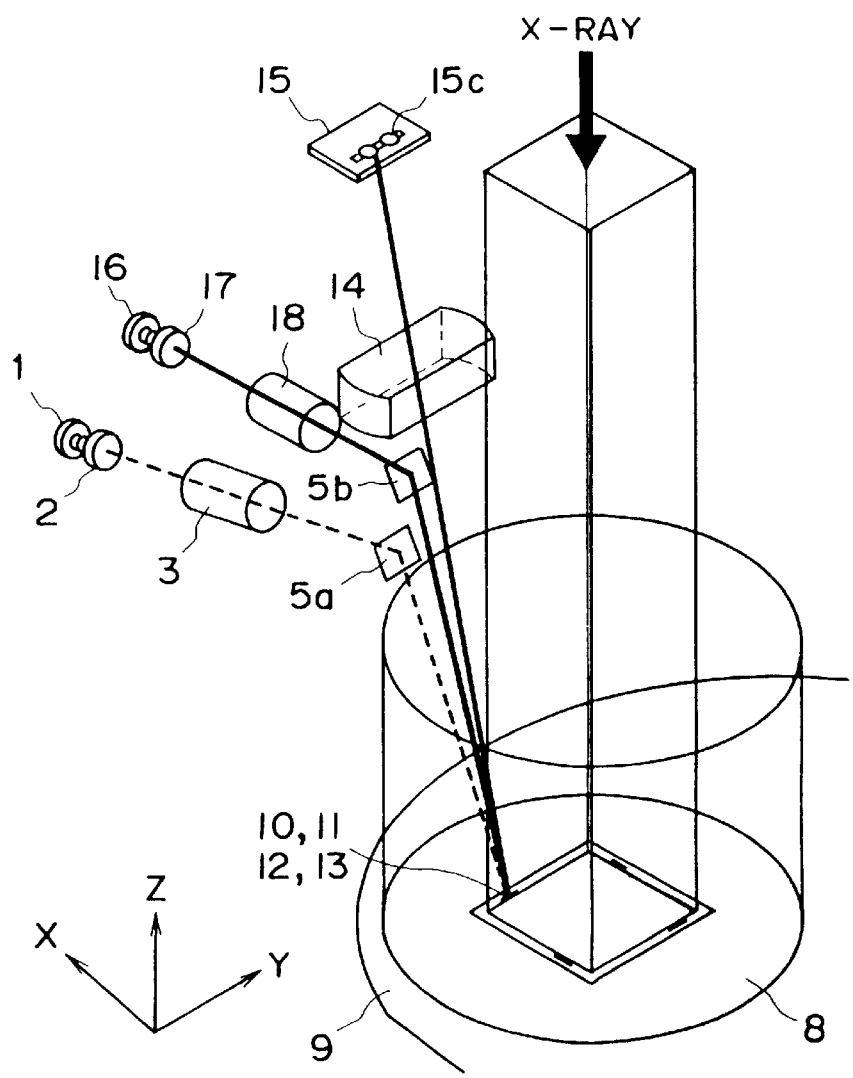
FIG. 9 is a schematic and perspective view of a main portion of a second embodiment of the present invention.
Figure 10:
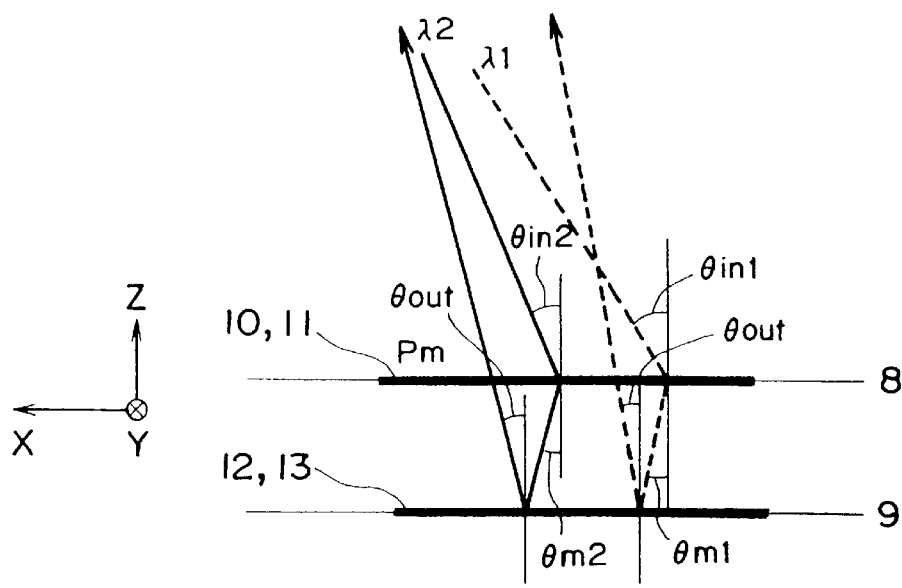
FIG. 10 is a schematic view for explaining a portion of FIG. 9.

FIG. 9 is a schematic view of a main portion of a second embodiment of the present invention, and FIG. 10 is a schematic view for explaining a portion of FIG. 9. This embodiment differs from the first embodiment of FIG. 2A in that, as compared with the first embodiment wherein two alignment lights (wavelengths $\lambda_1$ and $\lambda_2$) are projected on the mask 8 at the same angle and wherein lights diffracted at different angles are received by different sensors 15a and 15b, in this embodiment, as shown in FIG. 9, alignment lights of different wavelengths $\lambda_1$ and $\lambda_2$ are projected on the mask 8 with different angles so that the same diffraction angle is assured, and so that alignment lights are received by the same line sensor 15c. The remaining portion of this embodiment has essentially the same structure as that of the first embodiment.

In FIG. 9, light of a wavelength $\lambda_1$ from a light source 1. such as an LD, for example, is transformed by a collimator lens 2 into parallel light. The parallel light goes through a light projecting lens 3, and it is reflectively deflected by a mirror 5a, such that it illuminates lateral deviation detecting physical optic elements 10 and 11 of a mask 8, placed within an exposure region 7, as well as physical optic elements 12 and 13 of a wafer 9. Diffraction light from the physical optic elements bears information that represents the amount of lateral deviation between the mask 8 and the wafer 9. The light is then imaged by a light receiving lens 14 upon a light receiving surface of a photodetector 15.

Similarly, light of a wavelength $\lambda_2$ from a light source 16 is transformed by a collimator lens 17 into parallel light. This parallel light goes through a light projecting lens 18, and it is deflected by a mirror 5b. Then, it impinges on the physical optic elements 10 and 11 of the mask 8, within the exposure region 7, and then on the physical optic elements 12 and 13 of the wafer 9. Diffraction light from the physical optic elements bears information that represents the amount of lateral deviation between the mask 8 and the wafer 9, and it is imaged by the light receiving lens 14 upon the light receiving surface of the photodetector 15. Here, the mirrors 5a and 5b are so adjusted that both of the lights of wavelengths $\lambda_1$ and $\lambda_2$ are projected on the alignment mark, within an X-Z plane as viewed in FIG. 9.

Referring to FIG. 10, the relation among the incidence angle of alignment light, the acceptance angle therefor, and the pitch of alignment marks in the X direction, will be explained. Here, it is assumed that the incidence angle of light of wavelength $\lambda_1$ is $\theta_{in1}$, the incidence angle of light of wavelength $\lambda_2$ is $\theta_{in2}$, the diffraction angle for the light of wavelength $\lambda_1$ at the alignment marks 10 and 11 on the mask 8 is $\theta_{m1}$, the diffraction angle for the light of wavelength $\lambda_2$ is $\theta_{m2}$, the pitch of zone plates in the X direction of the alignment marks 10 and 11 on the mask is Pw, and the acceptance angle for the lights of wavelengths $\lambda_1$ and $\lambda_2$ is $\theta_{out}$.

The relation among the incidence angle $\theta_{in1}$ of the wavelength $\lambda_1$, the diffraction angle $\theta_{m1}$ at the mask side alignment marks 10 and 11, and the pitch Pm, can be provided, in accordance with a diffraction formula of first order diffraction light, as follows:

$$Pm\{\sin(\theta_{in1}) - \sin(\theta_{m1})\} = \lambda_1 \quad (13)$$

The relation among the incidence angle $\theta_{in2}$ of the wavelength $\lambda_2$, the diffraction angle $\theta_{m2}$ at the mask side alignment marks 10 and 11, and the pitch Pm, can be provided, in accordance with a diffraction formula of first order diffraction light, as follows:

$$Pm\{\sin(\theta_{in2}) - \sin(\theta_{m2})\} = \lambda_2 \quad (14)$$

Similarly, in relation to the wafer side alignment marks, from diffraction formula of first order diffraction light, it follows that:

$$Pw\{P \sin(\theta_{out}) - \sin(\theta_{m1})\} = \lambda_1 \quad (15)$$

$$Pw\{P \sin(\theta_{out}) - \sin(\theta_{m2})\} = \lambda_2 \quad (16)$$

This embodiment is designed with a wavelength $\lambda_1$=785 nm, an incidence angle $\theta_{in}$=15 deg., and a diffraction angle $\theta_{m1}$=0 deg. The pitch Pm of the mask side marks in this case is, from equation (13), Pm=3.03 microns.

Also, the designed acceptance angle $\theta_{out}$ is 10 deg., and the pitch Pw of the wafer side marks in this case is, from equation (15), Pw=4.52 microns. Then, from equation (16), the incidence angle $\theta_{m2}$ of the light of wavelength $\lambda_2$=630 nm upon the wafer side mark can be calculated, such that $\theta_{m2}$=1.96 deg From equation (13), the incidence angle $\theta_{in2}$ of the wavelength $\lambda_2$ is $\theta_{in2}$=14 deg. In this manner, by using equations (13)–(16), with respect to desired wavelengths, respective incidence angles are determined such that the light is received at the same acceptance angle.

Figure 11:
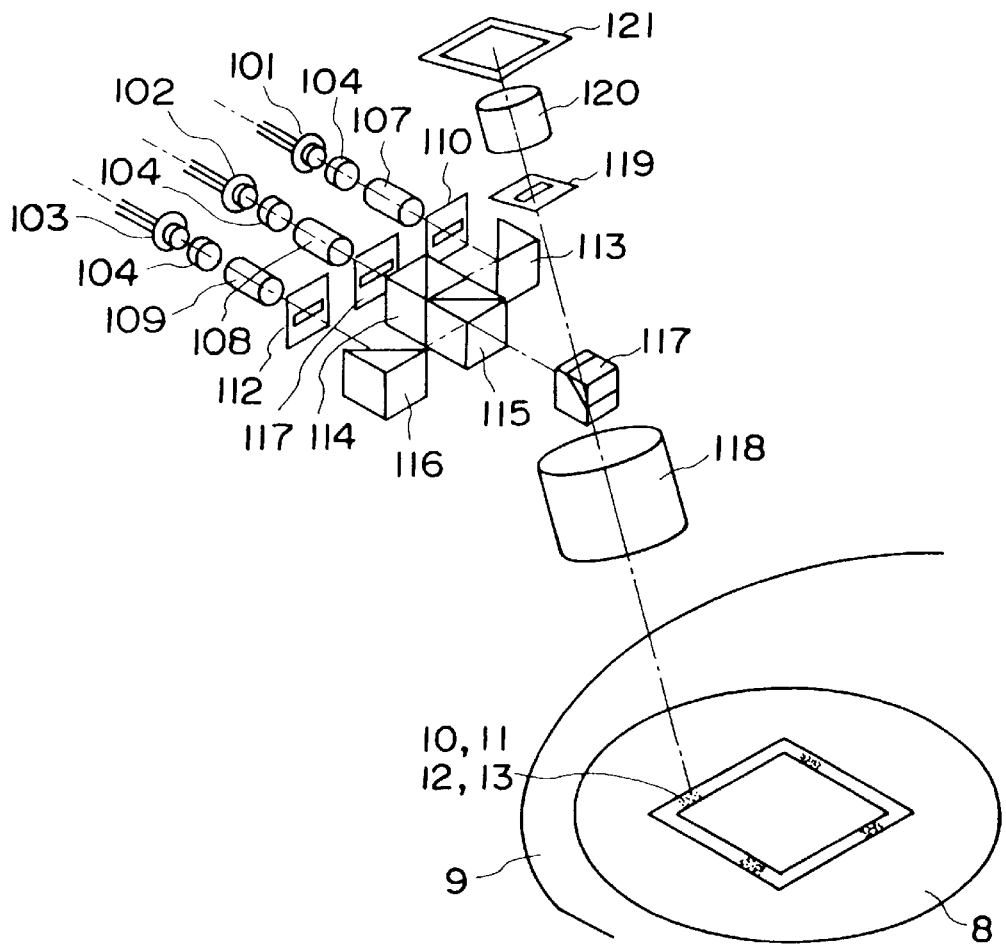
FIG. 11 is a schematic view of a main portion of a third embodiment of the present invention.

Referring to FIG. 11, a third embodiment of the present invention will be described. In this embodiment, the invention is applied to an alignment system for relatively aligning a mask and a wafer, in an exposure apparatus, for example.

In FIG. 11, there are light sources 101, 102 and 103 of mutually different wavelengths, each comprising an LD, for example. These light sources produce lights of wavelengths $\lambda_1$, $\lambda_2$ and $\lambda_3$, respectively. Light of wavelength $\lambda_1$ emitted from the light source 101 is transformed by a collimator lens 104 into parallel light. This parallel light goes via a lens 107, a field stop 110 for restricting the illumination region to a mark area, a mirror 113, dichroic mirrors 114 and 115, a mirror 117 and a lens 118, and it is projected on alignment marks 10 and 11 on the mask 8 as parallel light. Similarly, lights of wavelengths $\lambda_2$ and $\lambda_3$ emitted from the light sources 102 and 103 advance via lenses 108 and 109, field stops 111 and 112, a mirror 116, and dichroic mirrors 114 and 115, and they are projected on the alignment marks 10 and 11 of the mask 8 as parallel light. The light transmissively diffracted by the alignment marks 10 and 11 of the mask 8 is reflectively diffracted by alignment marks 12 and 13 provided on the wafer 9. Then, the light is transmitted through the mask 8 and through a lens 118, a field stop 119 and a lens 20, and it is imaged upon the light receiving surface of a sensor 121. The diffraction light as detected upon the sensor 121, that is, the alignment signal, has a S/N ratio which is variable in dependence upon the state of the alignment mark on the wafer 125, having been treated by a process or processes. Thus, out of the plural light sources, an appropriate wavelength is selected so as to assure detection with a best S/N ratio.

Here, an adjustment should be made to remove chromatic aberration of the alignment signal, being imaged at the sensor 121 position, resulting from changes in wavelength of alignment light used. This adjustment may be made by changing the spacing between the mask 8 and the wafer 9 in accordance with the wavelength to be used, similar to the embodiment described hereinbefore. Here, the field stop 119 may be disposed on a plane which is optically conjugate with the mask 8 or the wafer 9 with respect to the light receiving lens 119, so as to prevent mixture, at the sensor 121, of noise light which may be produced around the physical optic element of the mask or wafer. As for the light receiving lens 118, preferably a lens with chromatic aberration being corrected with respect to wavelengths of alignment light to be used, may be used. Further, the aperture size of the field stop 119 or the position thereof with respect to the optical axis direction may be made variable in accordance with the situation.

Next, an embodiment of a device manufacturing method which uses an exposure apparatus such as described above, will be explained.

Figure 12A:
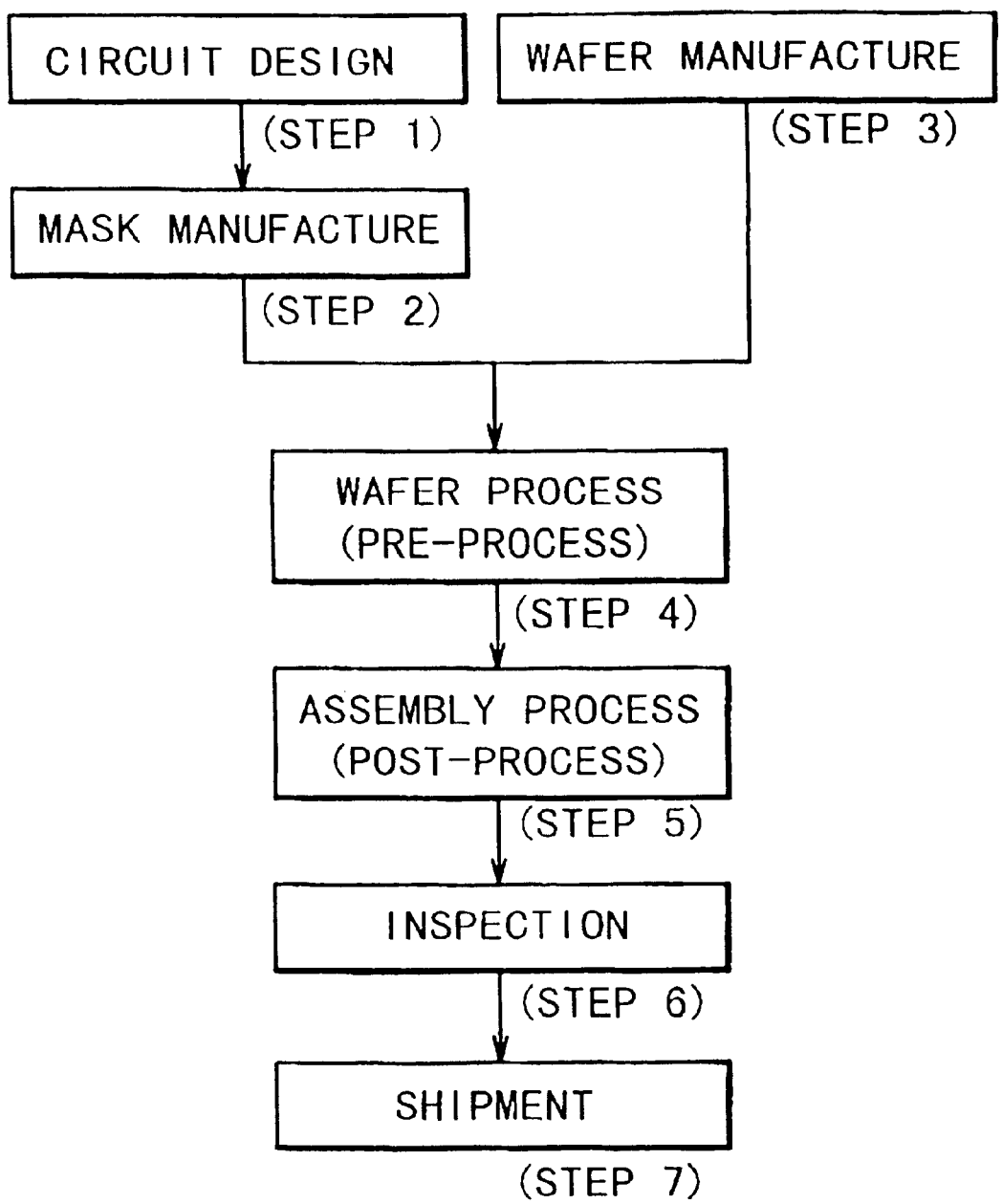
FIGS. 12A and 12B are flow charts of device manufacturing processes, in an embodiment of the present invention.

FIG. 12A is a flow chart of procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein operation check, a durability check and so on for the semiconductor devices provided by step 5, are carried out. With these processes, semiconductor devices are completed and they are shipped (step 7).

Figure 12B:
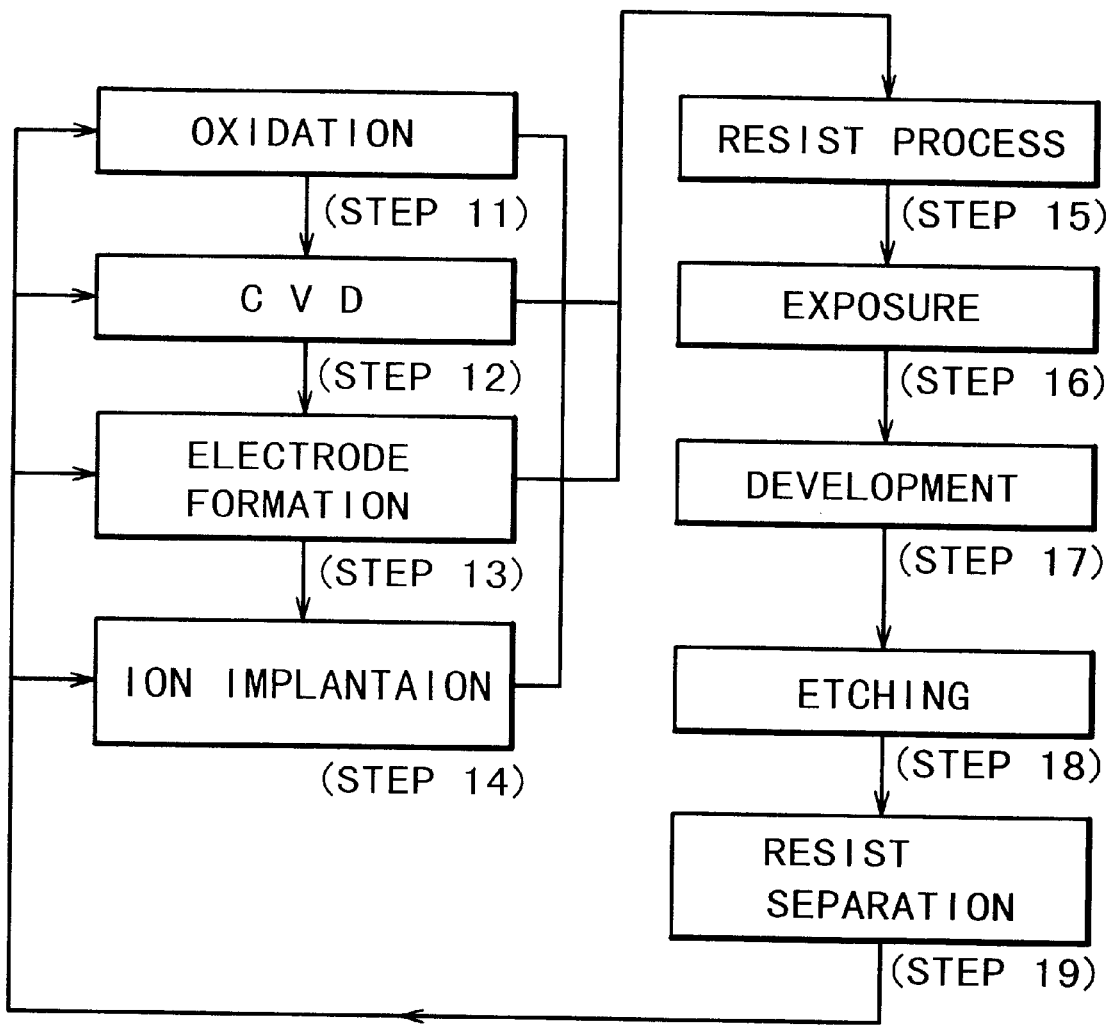

FIG. 12B is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, light projecting means for selecting light of an optimum wavelength in accordance with the material of a mask membrane, process dependency of a wafer or resist film thickness and for projecting the selected light and spacing setting means for changing the spacing between the surfaces of first and second objects are used, by which high precision detection of relative positional deviation between the first and second objects is assured even if the state of the first and/or second object changes. Thus, a position detecting system and a device manufacturing method using the same, capable of performing high precision alignment, are accomplished.

Particularly, a first physical optic element having a lens function is provided on the first object while a second physical optic element having a lens function is provided on the second object. Light projecting means for selectively projecting lights of different wavelengths to the first and second physical optic elements is provided, and spacing setting means for changing the spacing between the first and second objects in accordance with the selected wavelength, is provided. With this arrangement, light convergently or divergently emitted by the physical optic elements is assuredly collected on the detection surface, such that measurement with a good S/N ratio and good signal stability is enabled. This assures high precision position detection.

Additionally, wavelength selecting means may be provided to discriminate the state of a detection signal, out of detection signals corresponding to different wavelengths, and to select a detection signal to be used for practical position detection. This enables optimum light source wavelength setting in accordance with the material of a mask membrane, process dependency of a wafer or resist film thickness of the wafer. Thus, high precision alignment can be performed.

While the invention has been described with reference to the structures disclosed herein, it is not confined to the details set forth and this application is intended to cover such modifications or changes as may come within the purposes of the improvements or the scope of the following claims.

What is claimed is:

1. A system for producing relative positional information related to first and second objects, said system comprising:
    light projecting means for projecting light toward the first and second objects, which are disposed opposed to each other and have physical optic elements, said light projecting means having selecting means for selecting one of different wavelengths and for projecting the light of the one wavelength, for position detection;
    light detecting means for detecting light emitted from said light projecting means and being influenced by both of the physical optic elements of the first and second objects, wherein relative positional information related to the first and second objects is produced on the basis of the detection by said light detecting means; and
    spacing setting means for changing the spacing between the first and second objects in accordance with the selected wavelength of light projected by said light projecting means.

2. A system according to claim 1, wherein said selecting means selects a wavelength to be used, on the basis of an evaluation of detected alignment signals with respect to the different wavelengths, detected by said light detecting means.

3. A system according to claim 1, wherein said light detecting means includes plural light receiving elements for detecting the lights of different wavelengths, respectively.

4. A system according to claim 1, wherein said light projecting means projects the lights of different wavelengths with different angles.

5. A system according to claim 1, further comprising aperture means disposed in a portion of a light path between the physical optic elements and said light detecting means, for removing noise light.

6. A method of producing relative positional information related to first and second objects, said method comprising the steps of:
    projecting light toward the first and second objects, which are disposed opposed to each other and have physical optic elements, said light projecting step including a step of selecting one of different wavelengths and a step of projecting light of the one wavelength, for position detection;
    detecting light emitted in said light projecting step and being influenced by both of the physical optic elements of the first and second objects, wherein relative positional information related to the first and second objects is produced on the basis of the detection in said light detecting step; and
    changing the spacing between the first and second objects in accordance with the selected wavelength of light projected in said light projecting step.

7. A method according to claim 6, wherein said selecting step is arranged to select a wavelength to be used, on the basis of an evaluation of detected alignment signals with respect to the different wavelengths, detected said light detecting step.

8. A method according to claim 6, further comprising aligning plural second objects with respect to the first object in accordance with a detection of relative positional information based on a detection by use of different wavelengths, transferring a pattern of the first object to the second objects thus aligned, and determining a wavelength to be used for subsequent detection of relative positional information between the first and second objects.

9. An apparatus for transferring, by exposure, a pattern of a mask onto a workpiece, said apparatus comprising:
    light projecting means for projecting light toward the mask and the workpiece, which are disposed opposed to each other and have physical optic elements, said light projecting means having selecting means for selecting one of different wavelengths and for projecting light of the one wavelength, for position detection;
    light detecting means for detecting light emitted from said light projecting means and being influenced by both of the physical optic elements of the mask and the workpiece;
    spacing setting means for changing the spacing between the mask and the workpiece in accordance with the selected wavelength of light projected by said light projecting means; and
    an alignment system for aligning the mask and the workpiece with each other on the basis of the detection by said light detecting means, wherein the pattern of the mask is transferred to the workpiece thus aligned.

10. An apparatus according to claim 9, wherein said selecting means selects a wavelength to be used, on the basis of an evaluation of the detected alignment signals with respect to the different wavelengths, detected by said light detecting means.

11. An apparatus according to claim 9, wherein said light detecting means includes plural light receiving elements for detecting the lights of different wavelengths, respectively.

12. An apparatus according to claim 9, wherein said light projecting means projects the lights of different wavelengths with different angles.

13. An apparatus according to claim 9, further comprising aperture means disposed in a portion of a light path between the physical optic elements and said light detecting means, for removing noise light.

14. A device manufacturing method, comprising the steps of:
- projecting light toward a mask and a workpiece, which are disposed opposed to each other and have physical optic elements, said light projection step including a step of selecting one of different wavelengths and a step of projecting light of the one wavelength, for position detection;
- detecting light emitted in said light projecting step and being influenced by both of the physical optic elements of the mask and the workpiece;
- changing the spacing between the mask and the workpiece in accordance with the selected wavelength of light projected in said light detecting step;
- aligning the mask and the workpiece on the basis of the detection in said detecting step;
- transferring, by exposure, a pattern of the mask onto the workpiece thus aligned; and
- performing a developing process to the exposed workpiece, whereby a device can be produced from the developed workpiece.

15. A method according to claim 14, wherein said selecting step selects a wavelength to be used, on the basis of an evaluation of preceding wafers having been exposed with respect to the different wavelengths, inspected by an inspection apparatus.

16. A system for producing relative positional information related to first and second objects, said system comprising:
- light projecting means for projecting light toward the first and second objects, which are disposed opposed to each other and have physical optic elements, said light projecting means being capable of projecting lights of different wavelengths;
- light detecting means for detecting light emitted from said light projecting means and being influenced by both of the physical optic elements of the first and second objects, wherein relative positional information related to the first and second objects is produced on the basis of the detection by said light detecting means;
- spacing setting means for changing the spacing between the first and second objects in accordance with a wavelength of light projected by said light projecting means; and
- selecting means for selecting a wavelength to be used, on the basis of a comparison made to light intensity distributions with respect to the different wavelengths, detected by said light detecting means.

17. A system for producing relative positional information related to first and second objects, said system comprising:
- light projecting means for projecting light toward the first and second objects, which are disposed opposed to each other and have physical optic elements, said light projecting means being capable of projecting lights of different wavelengths and projecting the lights of different wavelengths with different angles;
- light detecting means for detecting light emitted from said light projecting means and being influenced by both of the physical optic elements of the first and second objects, wherein relative positional information related to the first and second objects is produced on the basis of the detection by said light detecting means; and
- spacing setting means for changing the spacing between the first and second objects in accordance with a wavelength of light to be projected by said light projecting means.

18. A method of producing relative positional information related to first and second objects, said method comprising the steps of:
- projecting light toward the first and second objects, which are disposed opposed to each other and have physical optic elements, said light projecting step being capable of projecting lights of different wavelengths;
- detecting light emitted in said light projecting step and being influenced by both of the physical optic elements of the first and second objects, wherein relative positional information related to the first and second objects is produced on the basis of the detection in said light detecting step;
- changing the spacing between the first and second objects in accordance with a wavelength of light projected in said light projecting step; and
- selecting a wavelength to be used, on the basis of a comparison made to light intensity distributions with respect to the different wavelengths detected in said light detecting step.

19. An apparatus for transferring, by exposure, a pattern of a mask onto a workpiece, said apparatus comprising:
- light projecting means for projecting light toward the mask and the workpiece, which are disposed opposed to each other and have physical optic elements, said light projecting means being capable of projecting lights of different wavelengths;
- light detecting means for detecting light emitted from said light projecting means and being influenced by both of the physical optic elements of the mask and the workpiece;
- spacing setting means for changing the spacing between the mask and the workpiece in accordance with a wavelength of light to be projected by said light projecting means;
- an alignment system for aligning the mask and the workpiece with each other on the basis of the detection by said light detecting means, wherein the pattern of the mask is transferred to the workpiece thus aligned; and
- selecting means for selecting a wavelength to be used, on the basis of a comparison made to light intensity distributions with respect to the different wavelengths, detected by said light detecting means.

20. An apparatus for transferring, by exposure, a pattern of a mask onto a workpiece, said apparatus comprising:
- light projecting means for projecting light toward the mask and the workpiece, which are disposed opposed to each other and have physical optic elements, said light projecting means being capable of projecting lights of different wavelengths, and projecting the lights of different wavelengths with different angles;
- light detecting means for detecting light emitted from said light projecting means and being influenced by both of the physical optic elements of the mask and the workpiece;
- spacing setting means for changing the spacing between the mask and the workpiece in accordance with a wavelength of light to be projected by said light projecting means; and
- an alignment system for aligning the mask and the workpiece with each other on the basis of the detection by said light detecting means, wherein the pattern of the mask is transferred to the workpiece thus aligned.

* * * * *

UNITED STATES PATENT AND TRADEMARK OFFICE
CERTIFICATE OF CORRECTION

PATENT NO. : 6,421,124 B1
DATED : July 16, 2002
INVENTOR(S) : Takahiro Matsumoto et al.

It is certified that error appears in the above-identified patent and that said Letters Patent is hereby corrected as shown below:

<u>Title page,</u>
Item [57], ABSTRACT,
Line 2, "is" should be deleted.

<u>Column 2,</u>
Line 38, "detected" should read -- detected. --.

<u>Column 6,</u>
Line 59, "changes" should read -- changes. --.
Line 60, "it" should read -- if --.

<u>Column 8,</u>
Line 30, "1." should read -- 1 --.

<u>Column 9,</u>
Line 32, "deg" should read -- deg. --.

<u>Column 12,</u>
Line 22, "detected" should read -- detected in --.

Signed and Sealed this

Eleventh Day of February, 2003

JAMES E. ROGAN
*Director of the United States Patent and Trademark Office*